United States Patent [19]

Kraus et al.

[11] Patent Number: 4,535,388
[45] Date of Patent: Aug. 13, 1985

[54] HIGH DENSITY WIRED MODULE

[75] Inventors: Charles J. Kraus, Poughkeepsie; Herbert I. Stoller, Wappingers Falls; Leon L. Wu, Hopewell Junction, all of N.Y.

[73] Assignee: International Business Machines Corporation, Armonk, N.Y.

[21] Appl. No.: 626,359

[22] Filed: Jun. 29, 1984

[51] Int. Cl.$^3$ .............................................. H05K 1/08
[52] U.S. Cl. .................................... 361/414; 361/410; 339/18 C
[58] Field of Search ............... 361/410, 414, 416, 409; 174/68.5; 339/18 R, 18 C

[56] References Cited

U.S. PATENT DOCUMENTS

| | | |
|---|---|---|
| 3,133,773 | 5/1964 | Ecker . |
| 3,485,934 | 12/1969 | Prather ............................. 174/68.5 |
| 3,499,098 | 3/1970 | McGahey et al. ................. 174/68.5 |
| 3,509,268 | 4/1970 | Schwartz et al. .................. 174/68.5 |
| 3,512,255 | 5/1970 | Hayden et al. ....................... 29/624 |
| 3,564,114 | 2/1971 | Blinder et al. ..................... 174/68.5 |
| 3,838,317 | 9/1974 | Coyne ................................. 174/68.5 |
| 3,895,181 | 7/1975 | LaGrange .......................... 361/414 |
| 3,898,370 | 8/1975 | Davy .................................. 361/414 |
| 4,041,547 | 8/1977 | Loose ................................. 361/410 |
| 4,237,522 | 12/1980 | Thompson ......................... 361/392 |
| 4,252,991 | 2/1981 | Iwabushi ............................ 174/68.5 |
| 4,298,770 | 11/1981 | Nishihara ........................... 361/409 |
| 4,362,899 | 12/1982 | Borrill ................................. 174/36 |

OTHER PUBLICATIONS

IBM Tech. Discl. Bull., vol. 21, No. 3, Aug. 1978, "Via Placement . . . Substrates", Melvin, p. 1021.
IBM TDB, vol. 14, No. 4, Sep. 1971, pp. 1316–1317.
IBM TDB, vol. 24, No. 1B, Jun. 1981, pp. 730–731.

Primary Examiner—G. P. Tolin
Attorney, Agent, or Firm—Robert J. Haase

[57] ABSTRACT

The wiring nets on a module are divided into two groups of planes, i.e., an upper group in which wiring is placed along "north-south" and "east-west" directions and a lower group in which wiring is placed along diagonal directions. All vias for connecting to the wiring pass through the upper group of planes but only half of the vias pass through the lower group of planes. Thus the spacing between the vias of the lower group of planes is greater than the spacing between the upper vias, allowing more lines per wiring channel in the lower group of planes.

5 Claims, 5 Drawing Figures

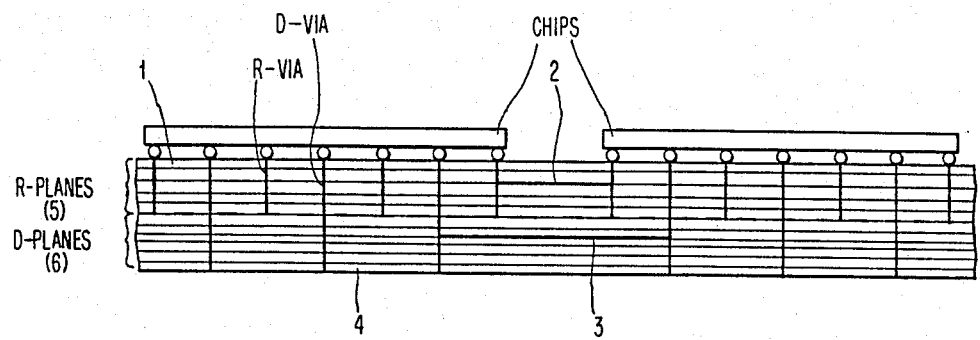
FIG. 1
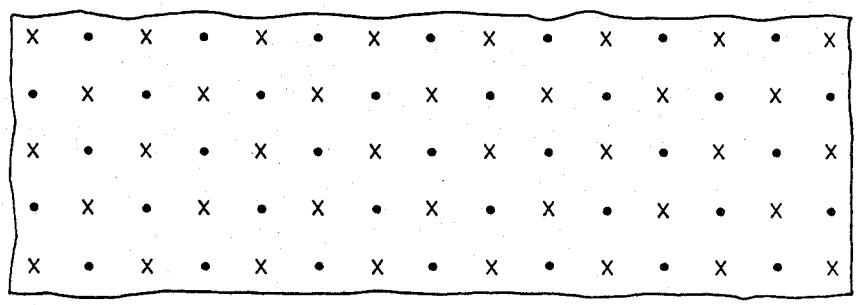
FIG. 2A R-PLANE VIAS
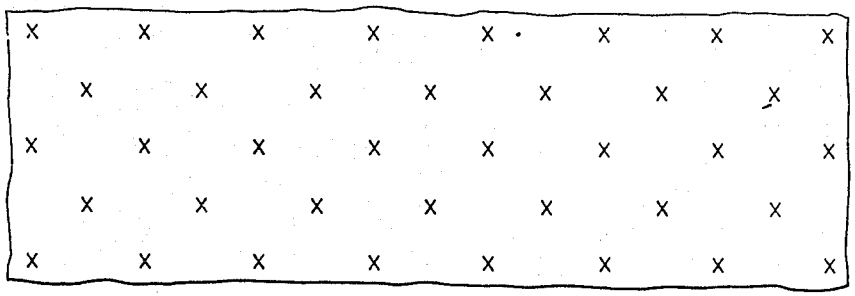
FIG. 2B D-PLANE VIAS

HIGH DENSITY WIRED MODULE

BACKGROUND OF THE INVENTION

1. Field of the Invention

The invention generally relates to modules for semiconductor device chips and, more particularly, to such modules having two contiguous groups of internal wiring planes providing wiring channels running in different respective directions.

2. Description of the Prior Art

Various methods have been employed for routing interconnecting wires for chips mounted on ceramic substrates. Basically, the methods fall into two categories, i.e., the interconnecting lines run rectangularly (parallel to the sides of the module) or diagonally relative to the sides of the module. The optimum connecting path of minimum length is selected depending upon the location of the two chip terminals to be connected together relative to the existing rectangular or diagonal pathway. Vias are used to change wiring direction from north-south to east-west, for example.

The considerations involved in choosing rectangular or diagonal chip interconnecting pathways on a module are discussed in IBM ® Technical Disclosure Bulletins of June 1981, page 730 "45% Wiring Layers For A Thin Film Module Package" by A. Deutsch and C. W. Ho, and September 1971, page 1316 "Use Of Relatively Diagonal And Rectangular Wiring Planes In Multilayer Packages" by E. C. Layden.

The former TDB points out the potential line length savings in using diagonal interconnecting lines to meet the demands of very large scale integration chip modules. Reducing the length of chip interconnections on a module not only reduces resistive losses but propagational delays as well. The cited September 1971 TDB teaches the use of a mixture of rectangular and diagonal wiring levels in a multilevel board, the two different routing directions being employed on alternate levels throughout the board. Shortest path connections from the chips to the selected rectangular or diagonal wiring level are made through interstitial vias which run transversely through the board into contact with the wiring pathways available on the opposite sides of the various board levels.

The January 1978 TDB, page 3092, shows a semiconductor package structure having a multilevel metallurgy system, each level comprising orthogonal wiring plane pairs. In order to minimize cross-sectional noise coupling, the adjacent wiring plane pairs (each of which are provided with rectangular wiring pathways) are disposed diagonally with respect to each other.

U.S. Pat. No. 4,298,770, issued on Nov. 3, 1981 to Nishihara et al. and entitled "Printed Board" discloses the application of rectangular and diagonal conduction pathways to printed circuit boards. The concepts are modified somewhat with respect to the other cited prior art, in that several different diagonal directions are proposed in order to increase wiring pattern selection flexibility over the case where only 45° diagonal directions are made available to the module wiring designer.

Although the prior art wiring techniques address the general problem of wire routing on a given level to achieve reduced wiring path lengths between points which are desired to be interconnected, close attention has not been directed to the overall optimization of level wiring as well as via interconnection wiring along the third dimension, i.e., the depth dimension of the module.

SUMMARY OF THE INVENTION

Advantage is taken of the fact that the number of used vias normally decreases as the depth of the wiring levels increases within a module. That is, most of the vias, penetrating through the top wiring level of the module, are used to establish interconnection pathways between semiconductor chip devices mounted on the module. Fewer and fewer of the vias are so used as they reach deeper wiring levels of the module. This is the natural result of a planar package structure.

The present invention exploits this natural design tendency by defining two types of wiring levels. The first type provides for rectangular direction wiring and has a first via density. The second type provides for diagonal direction wiring and has one half the first via density. That is, only half the first vias penetrate into the second type wiring levels, all of which are grouped together and placed below the first type wiring levels. Due to the decreased via-density of the second type wiring levels, an increased number of diagonally directed wires can be placed between the existing vias relative to the number of rectangularly directed wires places between the vias of the first type wiring levels. The result is a reduction in the number of wiring levels required and a reduction of average net interconnection pathway length, relative to prior art techniques. In order to fully exploit this structure, it is necessary to re-route some of the rectangular vias to diagonal vias. This can be accomplished by an automatic router within the rectangular planes.

BRIEF DESCRIPTION OF THE DRAWING

FIG. 1 is a simplified cross-sectional view of a multilevel module having grouped wiring levels in accordance with the present invention;

FIG. 2A is a plan view of one of the wiring levels of the upper group of levels of FIG. 1;

FIG. 2B is a plan view of one of the wiring levels of the lower group of levels of FIG. 1;

BEST MODE FOR CARRYING OUT THE INVENTION

Referring to FIG. 1, the present invention takes advantage of the fact that the number of used vias decreases with depth into the module. At the top plane pair surface 1, most of the vias are used (for simplicity and clarity of exposition only two examples, 2 and 3, of via wiring are shown). At the bottom plane pair surface 4, few vias are used. This reduction in via use is exploited in the present invention to increase the effective wiring channel capacity and offer a more flexible wiring path option for the module designer.

Two classes of wiring planes or levels are defined: the rectangular planes 5 (R-planes) and the Diagonal Planes 6 (D-planes). A via grid is shown in FIG. 2A for the R-planes. By eliminating every other diagonal row of vias in FIG. 2A, there remains the via grid shown in FIG. 2B. This is the via grid for the D-planes. It should be noted that the vias from the R-planes ("dot" vias plus "cross" vias) line up with those from the D-planes ("cross" vias only).

Thus, the R-plane vias comprise two types: R-vias which can only be connected to (or access) the R-planes, and D-vias which can access both the R and D planes. To use the flexibility of both the R and D planes, the wiring algorithms must be able to reuse the D-vias by allowing crossovers from R-vias to D-vias.

Figure 3A:
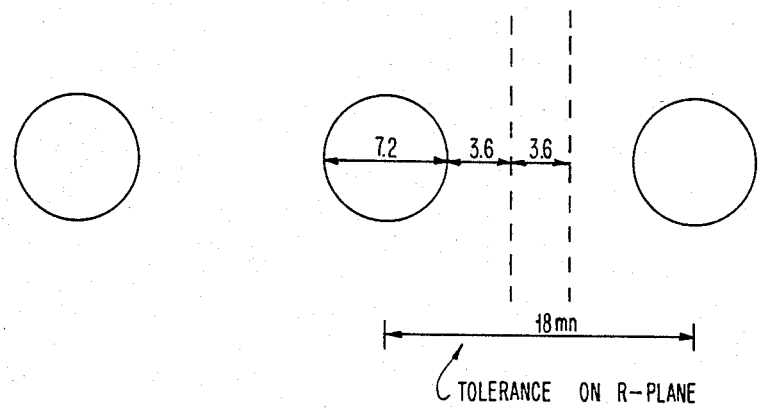
FIG. 3A is an enlarged view of FIG. 2A showing rectangularly directed wiring between the vias.
Figure 3B:
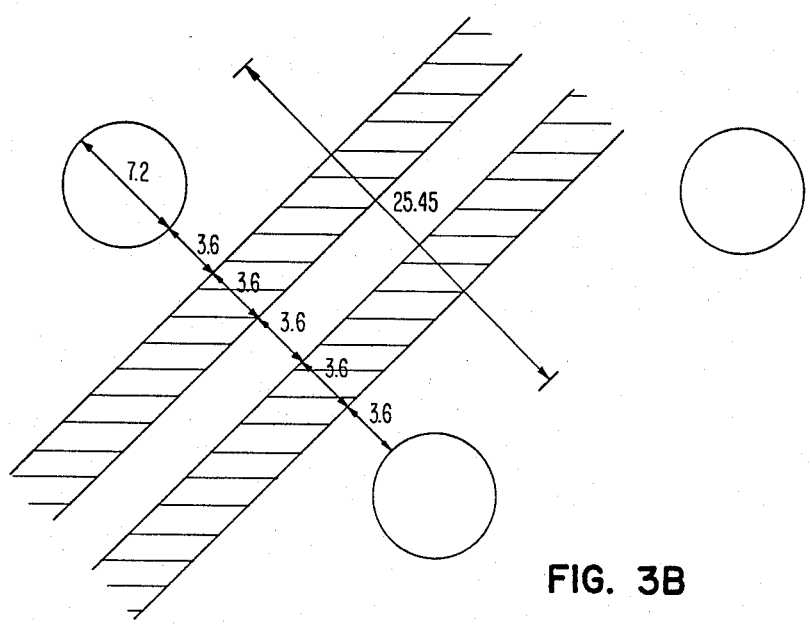
FIG. 3B is an enlarged view of FIG. 2B showing diagonally directed wiring between the vias.

Using the D-via grid it is possible, without any modification to existing ground rules, to run two wiring lines per wiring channel in the diagonal directions as is illustrated in FIG. 3B. As illustrated, for an illustrative 18 mil via grid design, the channel density is two lines per 25.45 mil diagonal channel on the D-plane (for the same process tolerances). This is a 40% higher channel density than the one line per 18 mil channel on the R-plane as shown in FIG. 3A.

An advantage of the module wiring technique of the present invention is the availability of both rectangular and diagonal wiring channels. By allocating wiring interconnection networks requiring mostly rectangular wiring directions to the R-planes, and those requiring mostly diagonal wiring directions to the D-planes, the average network length can be significantly reduced. This means a further reduction in the number of plane pairs required.

As an example, consider a module which requires 20 plane pairs using a conventional approach, i.e. rectangular planes only. Using the technique of the present invention, the rectangular-like ten wiring networks are allocated to the top ten R-planes while the remaining diagonal-like networks are allocated to the ten remaining D-planes.

Because of the 40% greater channel capacity for the D-planes, the wiring which went on ten rectangular plane pairs can be handled on only seven D-plane pairs. The number of plane pairs required for this example is reduced from 20 to 17 because of the higher channel capacity on the D-planes. In addition there is also a 10% reduction in average network length resulting from having both diagonal and rectangular routes available. This further reduces by two the number of plane pairs required. Thus, the total number of plane pairs needed for this module design is reduced from 20 to 15 by using the technique of the present invention to achieve not only a cost improvement by also a performance enhancement.

What is claimed is:

1. A high density module with semiconductor device chips comprising:
    a first plurality of wiring planes, each having a first number of vias with a first number of wiring channels running orthogonally between said vias, and a first number of conductors in said channels,
    a second plurality of wiring planes, each having half said first number of vias corresponding to alternate ones of said first number of vias and with a greater than said first number of channels with second conductors running diagonally between said vias of said second plurality of wiring planes,
    said first planes being assembled into a first group and
    said second planes being assembled into a second group,
    said first group being placed between said chips and said second group.

2. The module defined in claim 1 and further including:
    said plurality of chips mounted on said module and connected to selected ones of said vias of said first plurality of wiring planes.

3. The module defined in claim 2 wherein said selected ones of said vias of said first plurality of wiring planes are connected together in respective combinations.

4. The module defined in claim 2 wherein said chips are further connected to selective ones of said vias of said second plurality of wiring planes.

5. The module defined in claim 4 wherein said selected ones of said vias of said second plurality of wiring planes are connected together in respective combinations.

* * * * *